United States Patent [19]
Saka et al.

[11] Patent Number: 5,742,005
[45] Date of Patent: Apr. 21, 1998

[54] ELECTRICAL CONNECTION BOX

[75] Inventors: Yuuji Saka; Takahiro Onizuka, both of Yokkaichi, Japan

[73] Assignee: Sumitomo Wiring Systems, Ltd., Japan

[21] Appl. No.: 514,956

[22] Filed: Aug. 14, 1995

[30] Foreign Application Priority Data

Sep. 14, 1994 [JP] Japan .................................. 6-220608

[51] Int. Cl.⁶ .................................................. H02G 3/08
[52] U.S. Cl. .......................... 174/52.1; 361/637; 361/641
[58] Field of Search .............................. 174/52.1, 68.2; 361/600, 601, 637, 641; 220/4.01, 4.02, 3.2

[56] References Cited

U.S. PATENT DOCUMENTS

| | | | |
|---|---|---|---|
| 3,579,046 | 5/1971 | Jordan | 317/120 |
| 4,952,753 | 8/1990 | Hayashi et al. | 174/52.1 |
| 4,959,018 | 9/1990 | Yamamoto et al. | 439/76 |
| 5,046,172 | 9/1991 | Moreux et al. | 361/332 |

FOREIGN PATENT DOCUMENTS 1-166419  11/1989  Japan .

*Primary Examiner*—Bot L. Ledynh
*Attorney, Agent, or Firm*—Anthony J. Casella; Gerald Hespos; Ludomir A. Budzyn

[57] ABSTRACT

To provide an electrical connection box which can easily respond to a change in the circuit construction among different types of vehicles and among different grades of the same type of vehicles, and can be generally used, an internal circuitry of an electrical connection box is divided into a common circuitry 1 and a special circuitry 2. A conductive layer on which the common circuitry 1 is formed and another conductive layer on which the special circuitry 2 is formed are arranged one over the other at different levels in a casing of the electrical connection box. The common circuitry 1 comprises flat busbars 10, whereas the special circuitry 2 preferably comprises a wire, longitudinal busbars 20, or a flat circuit 25 such as a flexible printed circuit (FPC) or a printed circuit board (PCB). The common circuitry 1 and the special circuitry 2 may alternatively be formed of the same conductive material.

6 Claims, 10 Drawing Sheets

| | A | B | C |
|---|---|---|---|
| (1) | O | O | O |
| (2) | O | O | X |
| (3) | X | O | O |
| (4) | X | X | O |
| (5) | O | O | O |
| (6) | O | X | X |
| (7) | O | O | O |
| (8) | O | O | X |
| (9) | O | O | O |
| (10) | O | O | O |

ELECTRICAL CONNECTION BOX

BACKGROUND OF THE INVENTION

1. Field of the Invention

The present invention relates to an electrical connection box for automotive vehicles and is particularly designed to, when an internal circuitry of the electrical connection box partially differs among different types of vehicles and among different grades of the same type of vehicles, enable the use of the same electrical connection box only by changing a different portion of the internal circuitry.

2. Description of the Prior Art

An electrical connection box used to connect a wiring harness for an automotive vehicle with a variety of wiring devices is adapted to realize a rational and economical junction connection of the wiring by concentrating points of junction connection on one location. A variety of types of such electrical connection boxes are being developed as the wiring harness is made more compact.

Generally, flat busbars formed of a conductive metal plate in conformity with a circuit pattern are used as an internal circuitry of an electrical connection box such as a junction box. A plurality of flat busbars are arranged one over another at a plurality of levels to compact the electrical connection box.

The busbars are formed by suitably bending the punched conductive metal plate. Accordingly, upon a change in the circuit pattern, a mold used to punch the metal plate needs to be changed, and the way the punched metal plate is bent differs. This leads to more labor and an increased cost.

In order to cope with the above problem, Japanese Unexamined Utility Model Publication No. 2-136989 discloses an electrical connection box in which a large current circuitry formed of busbars and a small current circuitry formed of wire and cramping terminals are accommodated at different levels.

Further, Japanese Unexamined Utility Model Publication No. 1-166419 discloses an electrical connection box in which a supply side circuitry connected with fuses F is formed of busbars indicated by bold lines, and a load side circuitry is formed by a combination of a wire and cramping terminals indicated by thin lines in FIG. 10.

The internal circuitry of the electrical connection box differs among different types of vehicles and among different grades of the same type of vehicles.

If the internal circuitry is divided into the large current circuitry and the small current circuitry as disclosed in the above publication No. 2-136989, the construction of the large current circuitry may differ since both necessary and unnecessary circuits thereof differ among different types of vehicles and among different grades of the same type of vehicles. Similarly, the construction of the supply side internal circuitry disclosed in the above publication No. 1-166419 may also differ.

Therefore, even if the internal circuitry is divided into the large current circuitry and the small current circuitry and the large current circuitry is formed by the busbars, or even if the internal circuitry is divided into the supply side circuitry and the load side circuitry and the supply side circuitry is formed by the busbars, the circuit construction differs among the different types and the different grades of vehicles. Therefore, there are many cases where new busbars have to be formed.

On the other hand, even in the small current circuitry formed by the wire and the cramping terminals or even in the load side circuitry, there are small current circuits required for all types and all grades of vehicles at the load side. These circuits include, for example, circuits connected with lamps such as head lights, and a circuit connected with a horn (honker). These circuits are common circuits which are required for any vehicle.

Thus, there is no problem in forming these common circuits by busbars. The formation of these circuits by wire and cramping terminals instead of the busbars may result in more labor to arrange the wire and to mount the cramping terminals.

In view of the above problems, it is an object of the invention to provide an electrical connection box which can be commonly used among different types of vehicles and among different grades of the same type of vehicles by partially changing a circuitry.

SUMMARY OF THE INVENTION

According to the invention, an internal circuitry is divided in a different manner from the prior art. Specifically, it is divided into a common circuitry which is needed independently of the type and the grade of the vehicle and a special circuitry which differs depending upon the type and the grade of the vehicle. The electrical connection box can be used for any vehicle only by changing the special circuitry.

Accordingly, the internal circuitry can be mounted in the electrical connection box while using the common circuitry as it is independent of the type and the grade of the vehicle and changing only the special circuitry in conformity with the type and grade of the vehicle. Therefore, the electrical connection box can easily be used for different types and different grades of vehicles, and can be designed with an enhanced degree of freedom.

Preferably, the common circuitry comprises flat busbars, and the special circuitry comprises a wire, longitudinal busbars, or a flat circuit such as a flexible printed circuit (FPC) or a printed circuit board (PCB). If the flat busbars are used for the common circuits, it obviates the need to separately form the busbars for different types and different grades of vehicles. Costs for the molds used to form the busbars can be reduced.

Alternatively, the common circuitry and the special circuitry may be formed of the same kind of conductive material, and the conductive material may comprise wires, longitudinal busbars arranged in a vertical direction, or flat circuits such as FPCs or PCBs. If the common circuits are formed not by the flat busbars which are formed by punching and bending a metal plate in conformity with the circuit pattern, but by wires, by longitudinal busbars or by flat circuits, the costs for the molds used to form the busbars can be reduced, and the degree of freedom in design can be enhanced. Further, the electrical connection box can have a simple internal construction, and can be assembled with an improved efficiency.

The longitudinal busbars are preferably narrow rectangular busbars formed of a conductive plate which are disposed such that their surfaces extend in the vertical direction. External terminals may be directly engaged and connected with either ones of the upper and lower edges of the longitudinal busbars. Alternatively, cramping terminals may be connected with either ones of the upper and lower edges of the longitudinal busbars and also be connected with external terminals.

BRIEF DESCRIPTION OF THE DRAWINGS

These and other objects, features and advantages of the present invention will become more apparent upon a reading of the following detailed description and accompanying drawings in which.

DETAILED DESCRIPTION OF THE PREFERRED EMBODIMENT

Figures 1A, 1B:
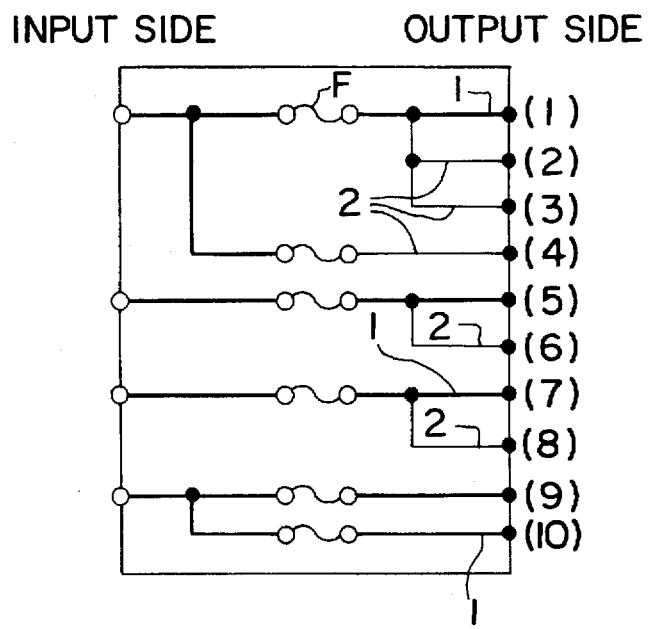
FIG. 1A is a schematic diagram showing a circuit construction of the invention.
FIG. 1B is a table showing standards for distinguishing a common circuitry and a special circuitry.
Figure 10:
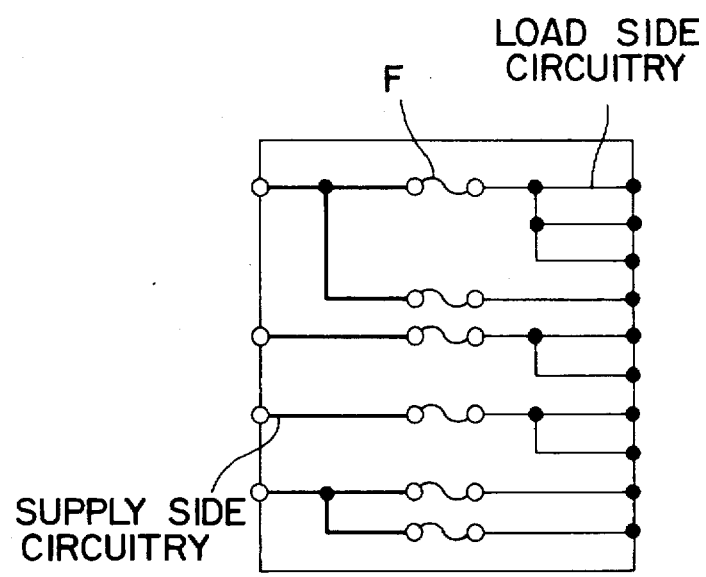
FIG. 10 is a schematic diagram showing the circuit construction of a prior art.

FIG. 1(A) is a schematic diagram of an internal circuitry provided in an electrical connection box. This internal circuitry has basically the same construction as the prior art shown in FIG. 10. In the prior art, the supply side circuitry upstream from the fuses F as indicated by bold lines in FIG. 10 is formed by the busbars, whereas the load side circuitry downstream from the fuses F as indicated by thin lines in FIG. 10 is formed by a combination of the wire and the cramping terminals. However, according to the invention, the internal circuitry is not divided by fuses F, but divided into a common circuitry 1 and a special circuitry 2. The common circuitry 1 indicated by bold lines in FIG. 1(A) is formed by flat busbars, and the special circuitry 2 indicated by thin lines in FIG. 1(A) is formed by a combination of a wire and cramping terminals.

More specifically, as shown in FIG. 1(B), out of circuits (1) to (10) connecting an input side to be connected with a power supply and an output side to be connected with respective wiring devices, the circuits (1), (5), (7), (9) and (10) are common circuits required for any of vehicles A, B and C as indicated by ○. For example, the circuit (1) is connected with a horn; the circuit (5) with headlights; the circuit (7) with back lights; the circuit (9) with a car radio; and the circuit (10) with taillights. All of the vehicles A, B and C are equipped with the horn, the headlights, the back lights, the car radio and the taillights.

The remaining circuits (2), (3), (4), (6) and (8) are not common circuits, i.e., are not required by some of the vehicles A, B and C as indicated by x in FIG. 1(B). These circuits belong not to the common circuitry 1, but to the special circuitry 2. For example, they are connected with power windows, a door lock, a sun-roof, an air-bag, etc.

Figure 2:
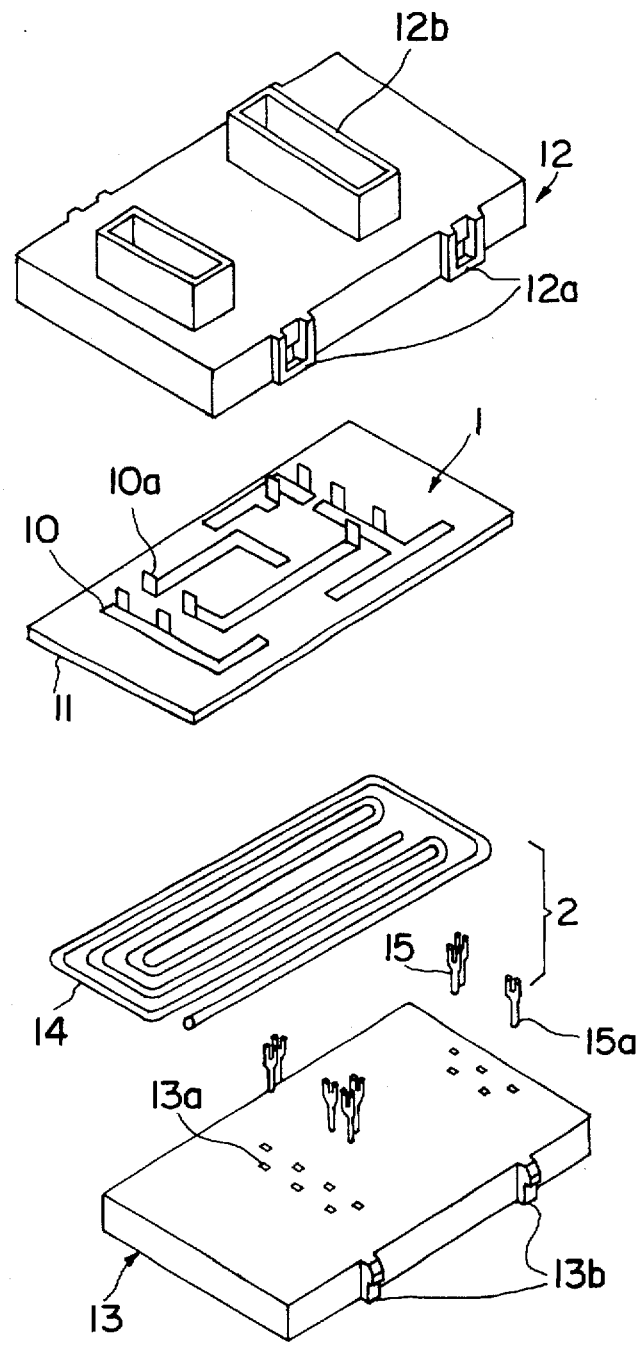
FIG. 2 is an exploded perspective view of a first embodiment of the invention.

As shown in FIG. 2, the common circuitry 1 is formed by flat busbars 10 formed by punching a conductive metal plate and bending specified parts of the punched metal plates to form tabs 10a. The flat busbars 10 are placed on the upper surface of an insulating plate 11, so that they can be horizontally arranged in the electrical connection box consisting of an upper casing 12 and a lower casing 13.

The special circuitry 2 is formed by a combination of a wire 14 and cramping terminals 15. The cramping terminals 15 are mounted into terminal holes 13a formed in the lower casing 13. The wire 14 is arranged and cramped with the cramping terminals 15 to form the special circuitry 2.

The common circuitry 1 formed by the flat busbars 10 and the special circuitry 2 formed of the wire 14 and the cramping terminals 15 are connected by cramping the wire with cramping terminal portions unitarily formed with the busbars.

In the electrical connection box assembled by putting the upper casing 12 and the lower casing 13 together and engaging respective locking portions 12a and 13b thereof, the special circuitry 2, a conductive layer formed by the combination of the wire 14 and the cramping terminals 15, is arranged at the lower level. External terminal connecting portions 15a of the cramping terminals 15 project outward (downward) from the terminal holes 13a of the lower casing 13 so that they can be connected with terminals of connectors fitted into connector receptacles (not shown) formed on the outer (lower) surface of the lower casing 13.

Further, in the electrical connection box, the common circuitry 1, a conductive layer formed of the flat busbars 10, is arranged above the wire 14 with the insulating plate 11 therebetween. The tabs 10a of the flat busbars 10 project from terminal holes (not shown) formed in connector receptacles 12b formed on the outer (upper) surface of the upper casing 12, so that they can be connected with terminals of connectors to be fitted into the receptacles 12b.

With the above electrical connection box, since the common circuitry 1 is used for all of the vehicles A to C, it is not necessary to form the flat busbars 10 of the common circuitry 1 in accordance with the type of the vehicle.

On the other hand, although the special circuitry 2 formed of the wire 14 and the cramping terminals 15 differs among the vehicles A to C, this can be coped with only by changing the positions of the cramping terminals to be connected with the wire 14.

Preferably, the special circuitry 2 is formed by the wire 14 and the cramping terminals 15 as follows. A groove is formed, for example, in the lower surface of the insulating plate 11 mounting the flat busbars 10 on its upper surface. After the wire 14 is inserted along this groove, the cramping terminals 15 are struck into the groove to be cramped with the wire 14. Alternatively, the special circuitry 2 may be formed by inserting the wire 14 along a groove formed in the inner surface of the lower casing 13 and then striking the cramping terminals 15 into this groove.

Figure 3:
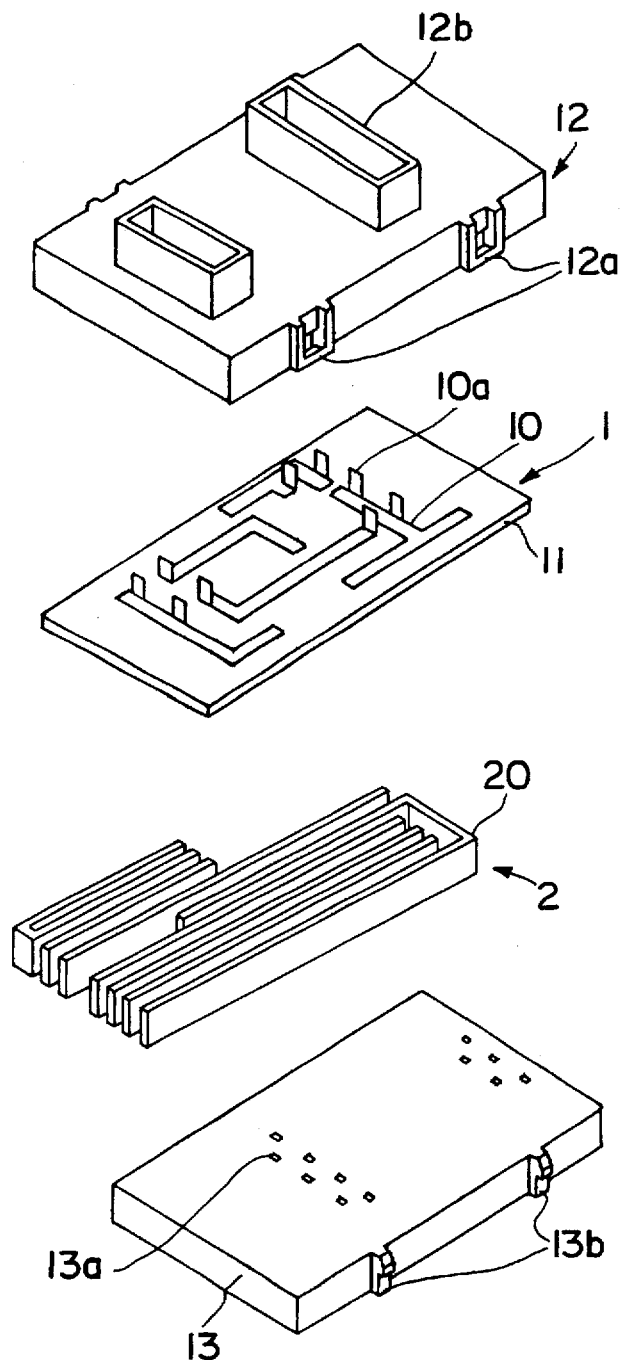
FIG. 3 is an exploded perspective view of a second embodiment of the invention.

FIG. 3 shows a second embodiment which is identical to the first embodiment in that the common circuitry 1 formed by the flat busbars 10 is arranged at the upper level in the electrical connection box, but differs therefrom in that the special circuitry 2 arranged at the lower level is formed by longitudinal busbars 20.

As illustrated, the longitudinal busbars 20 are narrow rectangular conductive plates, and are disposed such that their surfaces are parallel and in this embodiment extend in the vertical direction in the casing. External terminals (not shown) projecting inwardly from the terminal holes 13a of the lower casing 13 are directly engaged and connected with the lower edges of the longitudinal busbars 20.

As the remaining construction of the second embodiment is same as that of the first embodiment, description thereof is omitted by giving like reference numerals to like elements.

Since the common circuitry 1 is formed by the flat busbars 10 in the second embodiment as well, it can be commonly used for different vehicles. Further, since the special circuitry 2 is formed by the longitudinal busbars 20, the circuit construction can be changed only by changing the positions of the external terminals to be connected with the longitudinal busbars 20.

Figure 4:
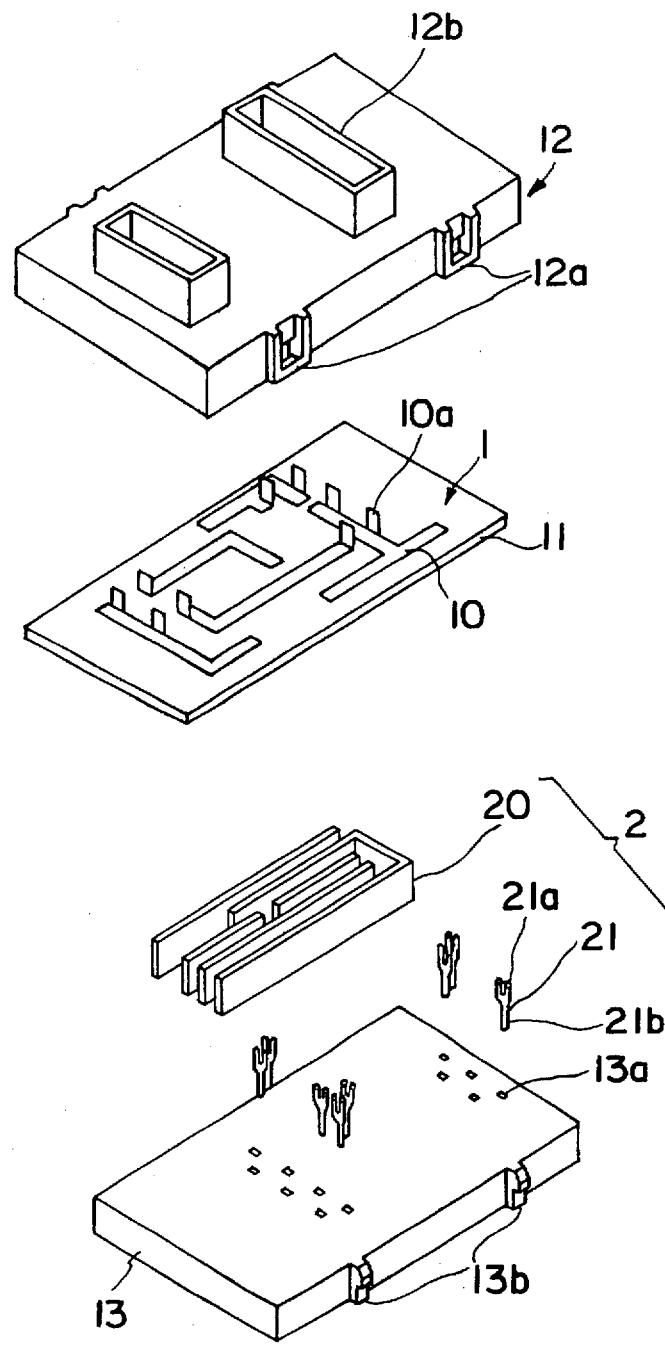
FIG. 4 is an exploded perspective view of a third embodiment of the invention.

FIG. 4 shows a third embodiment which is identical to the first embodiment in that the common circuitry 1 formed by the flat busbars 10 is arranged at the upper level in the electrical connection box, but differs therefrom in that the special circuitry 2 arranged at the lower level is formed by a combination of longitudinal busbars 20 and cramping terminals 21.

The longitudinal busbars 20 are fitted in slots 21a of the cramping terminals 21 in their specified positions. External terminal connecting portions 21b at the other ends of the cramping terminals 21 are so mounted as to project downwardly from the terminal holes 13a of the lower casing 13, so that they can be connected with external terminals.

As the remaining construction of the third embodiment is same as that of the first embodiment, description thereof is omitted by giving like reference numerals to like elements.

Since the common circuitry 1 is formed by the flat busbars 10 in the third embodiment as well, it can be commonly used for different vehicles. Further, since the special circuitry 2 is formed by the longitudinal busbars 20 and the cramping terminals 21, the circuit construction can be changed only by changing the connecting positions of the longitudinal busbars 20 with the cramping terminals 21.

Figure 5:
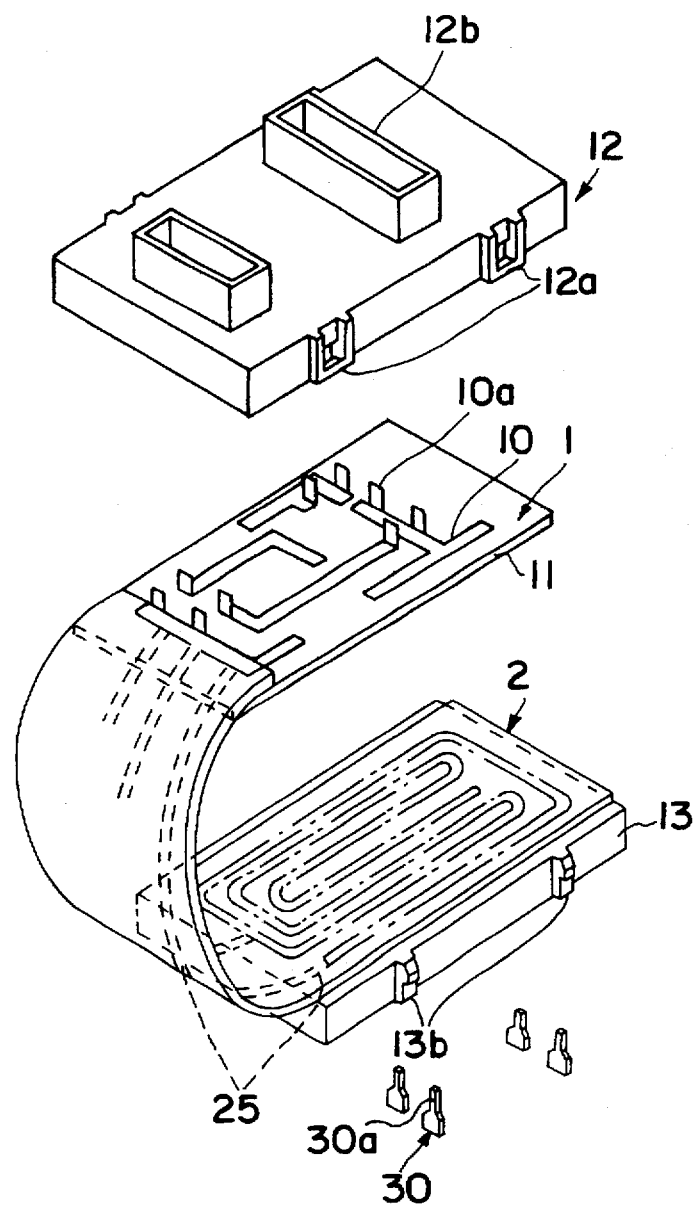
FIG. 5 is an exploded perspective view of a fourth embodiment of the invention.

FIG. 5 shows a fourth embodiment which is identical to the first embodiment in that the common circuitry 1 formed by the flat busbars 10 is arranged at the upper level in the electrical connection box, but differs therefrom in that the special circuitry 2 arranged at the lower level is formed by a flat circuit 25.

The flat circuit 25 may be a flexible printed circuit (FPC) formed by holding a copper leaf forming a circuit pattern between insulating sheets, a flexible wire circuit (FWC) formed by holding a thin wire between insulating sheets, a printed circuit board (PCB) formed by printing a copper leaf on an insulating board, or the like.

In the fourth embodiment, the FPC is used as the flat circuit 25. The FPC is secured on the lower casing 13 by means of soldering, and one end thereof is secured on the insulating plate 11 to be connected with the flat busbar(s) 10.

There are also tabs 30 separately formed of the flat circuit 25. A pin 30a is formed at the leading end of each tab 30. The pins 30a are pierced into a conductor of the flat circuit 25. The tabs 30 and the conductor are securely connected by soldering the leading ends of the pins 30a coming out of the conductor. The base ends of the tabs 30 are inserted into the terminals holes of the lower casing 13 so that they can be connected with external terminals.

Since the common circuitry 1 is formed by the flat busbars 10 in the fourth embodiment as well, it can be commonly used for different vehicles. Further, the special circuitry 2 can be changed only by replacing a flat circuit with a different circuit pattern. Thus, this embodiment can easily respond to a design change.

In embodiments shown in FIGS. 6 to 9, the common circuitry 1 and the special circuitry 2 are formed by the same kind of conductive layers.

Figure 6:
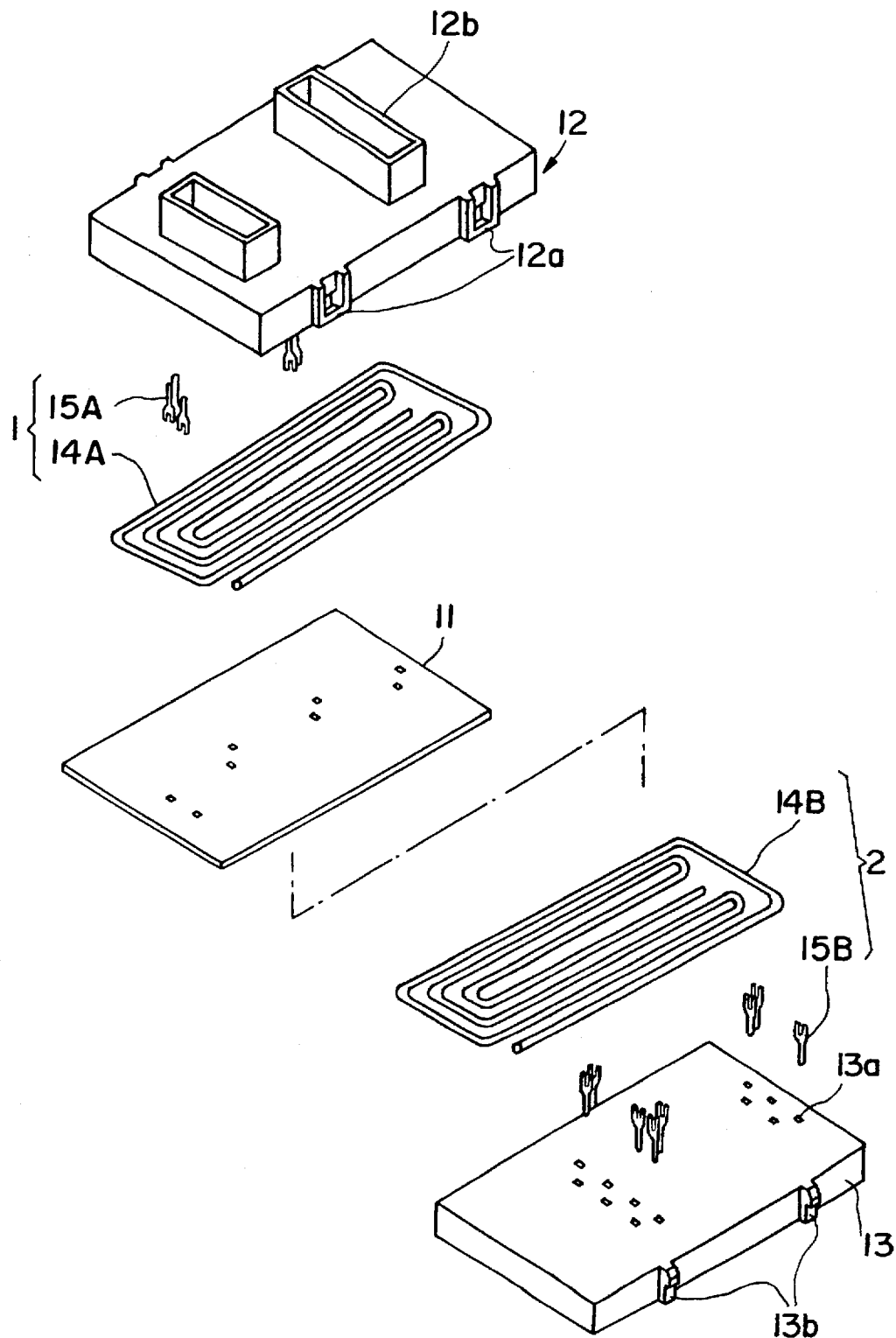
FIG. 6 is an exploded perspective view of a fifth embodiment of the invention.

More specifically, in a fifth embodiment shown in FIG. 6, both the common circuitry 1 and the special circuitry 2 are formed by a wire 14A and cramping terminals 15A, and a wire 14B and cramping terminals 15B, respectively.

The common circuitry 1 and the special circuit 2 are arranged at different levels above and below the insulating plate 11, respectively. The connection between the circuitries 1 and 2 is established by way of intermediate terminals (not shown) for connecting the cramping terminals 15A and 15B which are cramped with the wires 14A and 14B, respectively. Alternatively, the cramping terminals necessary for the connection may be gathered and connected by way of a sub-wire.

Figure 7:
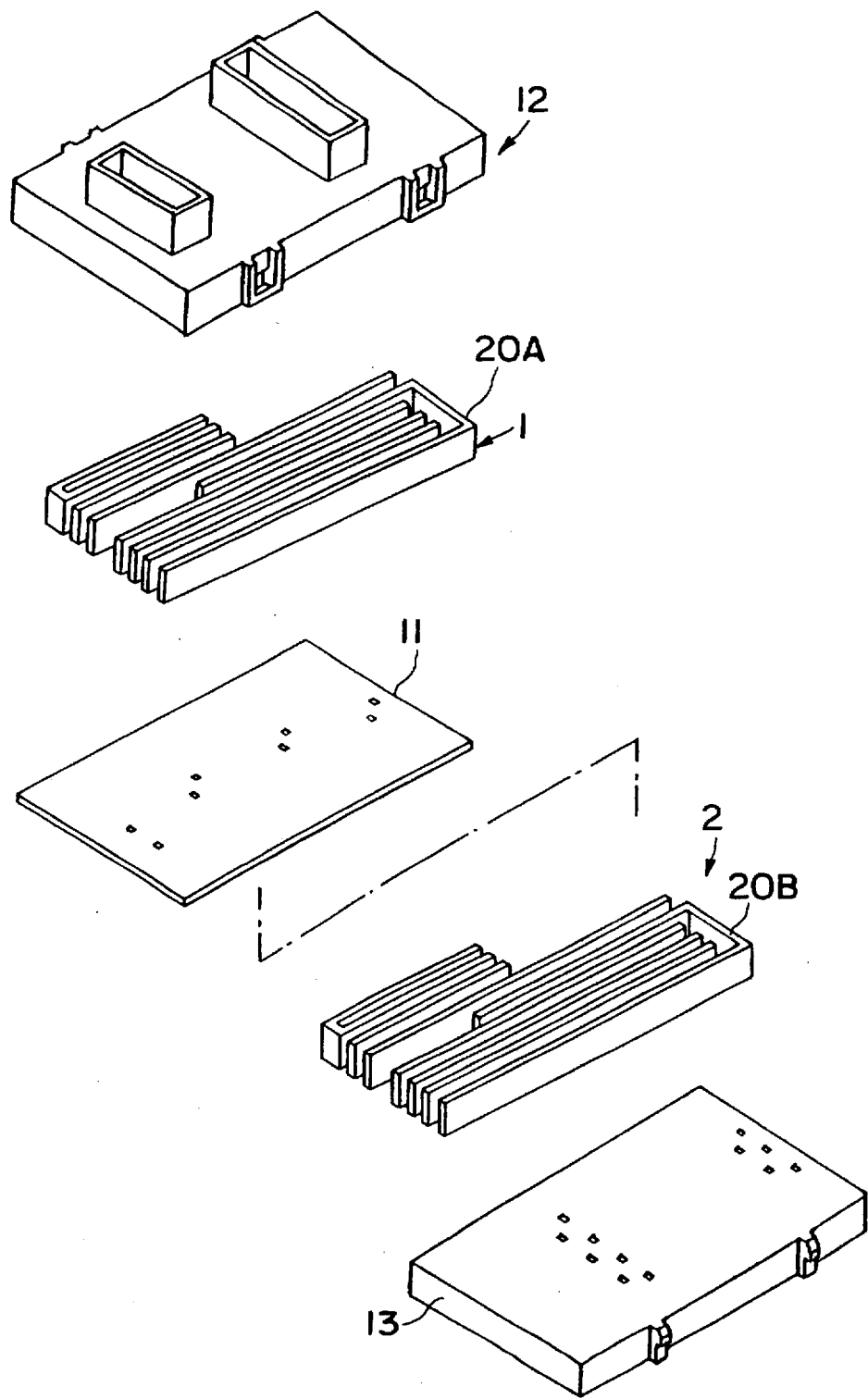
FIG. 7 is an exploded perspective view of a sixth embodiment of the invention.

In a sixth embodiment shown in FIG. 7, both the common circuitry 1 and the special circuitry 2 are formed by longitudinal busbars 20A and 20B, respectively. Connecting terminals mounted at the upper casing 12 and the lower casing 13 are directly connected with these longitudinal busbars 20A and 20B. The connection of the longitudinal busbars 20A and 20B is established, for example, by means of intermediate terminals (not shown) inserted into through holes formed in the insulating plate 11 mounted between them.

Figure 8:
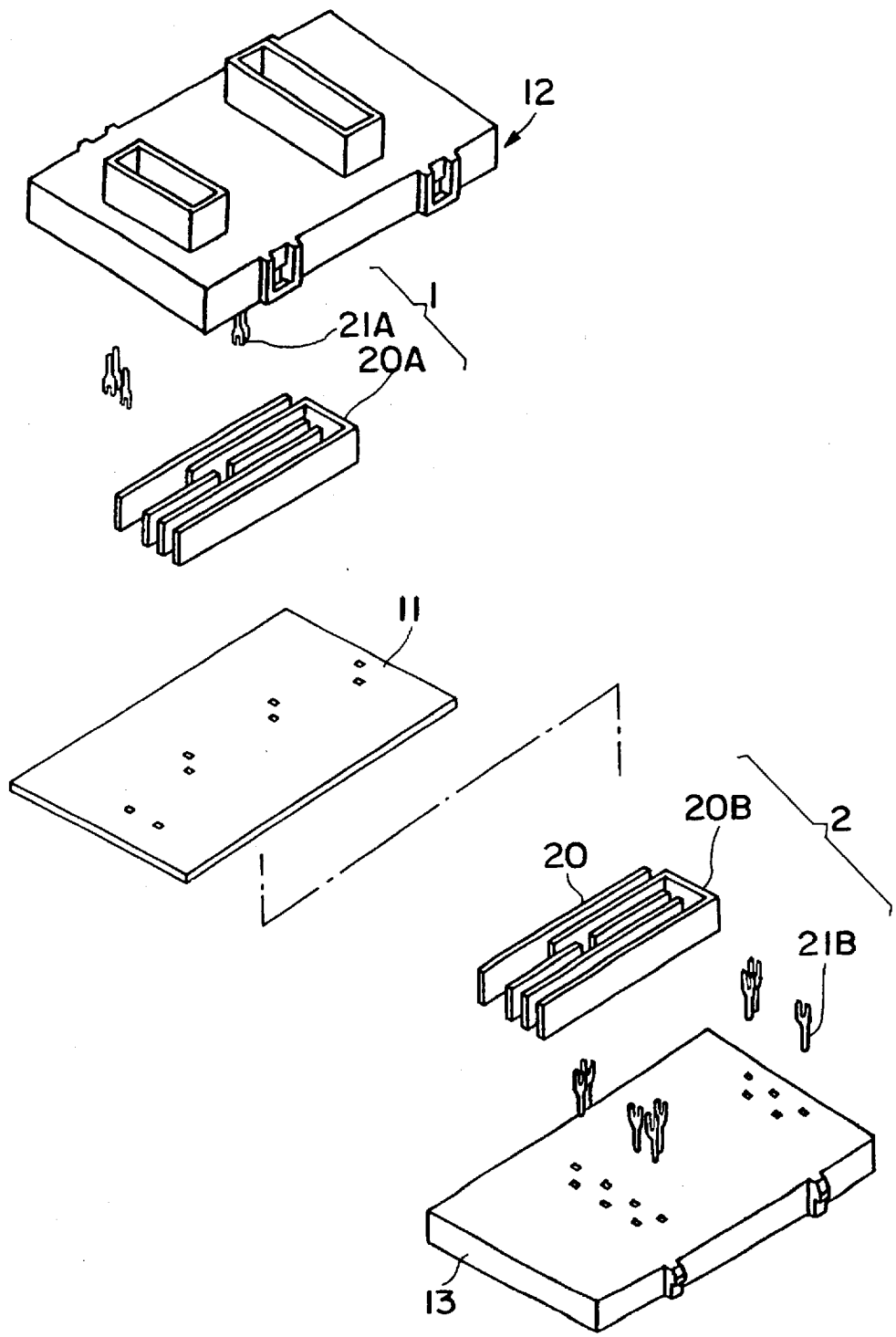
FIG. 8 is an exploded perspective view of a seventh embodiment of the invention.

In a seventh embodiment shown in FIG. 8, both the common circuitry 1 and the special circuitry 2 are formed by longitudinal busbars 20A, 20B and cramping terminals 21A, 21B, respectively.

The connection of the longitudinal busbars 20A and 20B is established, for example, by means of intermediate terminals (not shown) inserted into through holes formed in the insulating plate 11 mounted between them.

Figure 9:
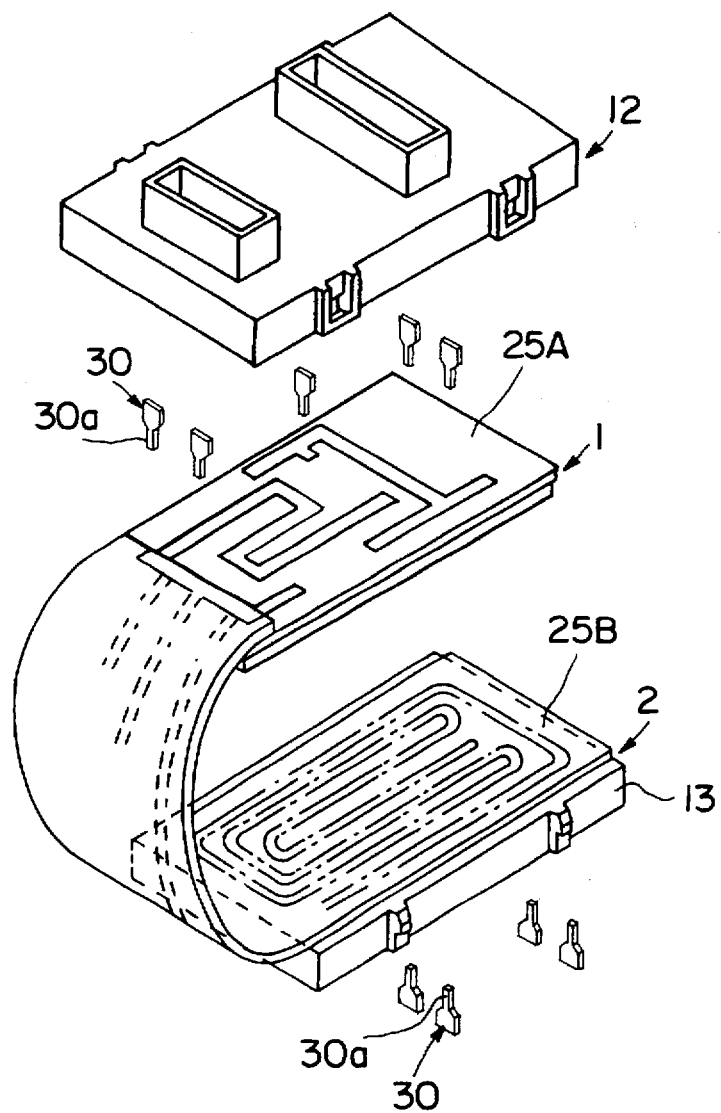
FIG. 9 is an exploded perspective view of an eighth embodiment of the invention.

In an eighth embodiment shown in FIG. 9, both the common circuitry 1 and the special circuitry 2 are formed by flat circuits 25A and 25B, respectively.

More specifically, the flat circuit 25A of the common circuitry 1 is secured on the upper surface of the insulating plate 11 by means of soldering. On the other hand, the flat circuit 25B of the special circuitry 2 is similarly secured on the inner surface of the lower casing 13. The leading end of a portion of the flat circuit 25B projecting from the lower casing 13 is secured on the insulating circuit 11 by means of soldering to connect the flat circuit 25B with the flat circuit 25A.

The flat circuits 25A and 25B are connected with external terminals as follows. Pins 30a of tabs 30 are struck into the conductors of the flat circuits 25A and 25B and are secured by means of soldering. The tabs 30 are mounted such that the other ends thereof project from terminal holes formed in the upper casing 12 and the lower casing 13 so as to be connected with the external terminals.

Since the common circuitry 1 and the special circuitry 2 are formed by the same kind of conductors in the fifth to eighth embodiments, the internal construction of the electrical connection box can be made simpler. Further, as the conductive layers can be formed in the same procedure, the electrical connection box can be more efficiently assembled.

What is claimed is:

1. An electrical connection box for connection to a selected one of a plurality of external circuits, said external circuits including a plurality of common external circuit elements that are substantially identical for all of said external circuits and a plurality of special external circuit elements that are not common for all of said external circuits, such that said external circuits achieve a plurality of different purposes, said electrical connection box having an internal circuitry, wherein:

the internal circuitry is divided into a common circuitry
(1) common for all purposes and connectable to the common external circuit elements and a special circuitry (2) which is not common for all purposes and connectable to the special external circuit elements of the selected external circuit, and a conductive layer (10;14A;20A;25A) on which the common circuitry (1) is formed and another conductive layer (14;20;25;14B;20B;25B) on which the special circuitry (2) is formed, said conductive layers being arranged one over the other at different levels in the electrical connection box, the conductive layer of the common circuitry (1) being formed by flat busbars (10) and having tabs (10a; 30) which extend into connector receptacles (12b) so as to form terminals for the connection of the common circuitry (1) with external circuitry, the special circuitry (2) being formed by longitudinal busbars (20).

2. An electrical connection box according to claim 1, wherein the conductive layer of the special circuitry (2) is formed by the longitudinal bus bars (20;20B), terminals for connection of the special circuitry (2) with external circuitry are formed by cramping terminals (21;21B) cramped to the longitudinal bus bars (20;20B).

3. A plurality of electrical connection boxes for connection respectively to a plurality of external circuits, said external circuits each including a plurality of common external circuit elements that are substantially identical for all of said external circuits and a plurality of special external circuit elements that are not common for all of said external circuits, such that said external circuits achieve a plurality of different purposes, each of said electrical connection boxes comprising a casing, a first conductive layer mounted in the casing and having common internal circuitry thereon, the common internal circuitry for each said electrical connection box in said plurality being substantially identical and being connectable to the common external circuit elements, each said electrical connection box further comprising a second conductive layer comprising longitudinal busbars supported in said casing in spaced relationship to said first conductive layer and having special internal circuitry thereon, the special internal circuitry in selected electrical connection boxes of said plurality being different form the special internal circuitry in other of said electrical connection boxes of said plurality, the special internal circuitry being connectable to the special external circuit elements of a selected one of said external circuits for achieving one of said plurality of different purposes.

4. A plurality of electrical connection boxes according to claim 3, wherein the first conductive layer comprises flat busbars.

5. A plurality of electrical connection boxes according to claim 4, wherein the first conductive layer comprises tabs which extend into connector receptacles so as to form terminals for the connection of the common internal circuitry with the common external circuit elements.

6. A plurality of electrical connection boxes according to claim 3, the special internal circuitry comprise cramping terminals which extend to the longitudinal busbars of the second conductive layer so as to be cramped thereto and establish connection therewith.

* * * * *